United States Patent
Takita

(10) Patent No.: US 6,580,260 B2
(45) Date of Patent: Jun. 17, 2003

(54) PWM FEEDBACK CONTROL BY USING DYNAMIC PULSE-TO-PULSE ERROR COMPENSATION

(75) Inventor: Mark Takita, Palo Alto, CA (US)

(73) Assignee: Nikon Corporation, Tokyo (JP)

( * ) Notice: Subject to any disclaimer, the term of this patent is extended or adjusted under 35 U.S.C. 154(b) by 77 days.

(21) Appl. No.: 09/839,109

(22) Filed: Apr. 19, 2001

(65) Prior Publication Data

US 2002/0153868 A1 Oct. 24, 2002

(51) Int. Cl.$^7$ ............................. G05F 5/00; H02M 1/12
(52) U.S. Cl. ......................................... 323/299; 363/41
(58) Field of Search ...................... 363/39, 40, 41, 363/50, 51, 55; 323/222, 282, 283, 284, 299, 301, 354

(56) References Cited

U.S. PATENT DOCUMENTS 2,982,156 A  *  5/1961  Weimer et al. ............. 323/222
5,132,894 A  *  7/1992  Rozman et al. ............... 363/51
5,694,949 A  *  12/1997  Reggiardo .................. 323/354

* cited by examiner

Primary Examiner—Jessica Han
(74) Attorney, Agent, or Firm—Liu & Liu

(57) ABSTRACT

The present invention relates to a closed-loop method of controlling the switch operation of a pulse width modulation circuit in the delivery of power to a load. This is done by measuring the power required of the input pulse, integrating the actual power delivered of the output pulse, calculating the power difference between the ideal pulse and the actual pulse, and compensating in the next pulse for error with appropriate offset. A high-speed processor compensates for the error, and generates a timing stream signal to control the modulation frequency of the PWM circuit. This is done on a pulse-to-pulse basis, thus allowing dynamic and nearly instantaneous error correction. Combined with existing PWM technology, the present invention increases the transfer efficiency and the linearity of power delivered to a load. As a direct benefit of precise switching control and low energy losses, smaller heat sink is required as well as less thermal stress is applied on the system. Further, the signal-to-noise ratio is increased, thus providing better power quality to the load. This increases the overall reliability and efficiency of the entire pulse modulation circuit.

11 Claims, 6 Drawing Sheets

PWM FEEDBACK CONTROL BY USING DYNAMIC PULSE-TO-PULSE ERROR COMPENSATION

BACKGROUND OF THE INVENTION

1. Field of the Invention

The present invention relates to systems for controlling the power applied to a load, and in particular to a method to improve the performance of pulse width modulation (PWM) amplification.

2. Description of Related Art

For certain load control applications, it is desirable to have a high degree of precision in terms of linearity and power transfer efficiency. For instance, photolithographic systems require high resolution when in the scanning mode. Therefore, power transfer must be highly linear for controlling the positioning stages in the photolithographic systems, requiring that a discrete change in the position control signal to result in a proportional discrete change in the output signal for the positioning stages. At other times, photolithographic systems operating in a stepping mode require rapid changes in the positioning of the stages, which demand efficient power transfer to generate large acceleration and deceleration forces.

One of the highly effective methods of power delivery control is the use of pulse modulation amplifiers. They are used to supply drive current to inductive loads, such as linear, voice-coil, and DC motors. A pulse modulation amplifier, such as a PWM amplifier, receives an analog waveform and outputs a series of square wave pulses. The square wave pulse has an amplitude and duration such that the integrated energy of the pulses is equivalent to the energy of the sampled input analog waveform multiplied by a gain factor created by the amplifier. The resulting PWM waveform may be filtered to produce an analog waveform replicating the original input waveform multiplied by the gain factor. The frequency of the desired sine wave is called the system frequency, while the frequency at which the switch operates is called the modulation frequency.

a. Prior Art Open-loop PWM

FIG. 1 is an example of a basic prior art PWM control circuit. The PWM controller 100 converts an analog input level Vs 110 into a variable duty cycle switch drive signal. As higher voltage output Vo 140 is required, the switch 120 is held on for a longer period. The switch 120 is usually both on and off once during each cycle of the switching frequency. As less voltage output is required, the duty cycle or percent of on time is reduced. A transistor operating as a switch dissipates no power when it is off and dissipates very little heat when it is on because of its low on-resistance. Other losses include heat generated in the flyback diode 150, which is small because the diode conducts only a very small portion of the time.

The inductor 130 stores energy during the on portion of the cycle for filtering. As a result, the load sees little of the modulating frequency but responds to the system frequency, which is significantly below the modulation frequency. With the PWM, the direct unfiltered amplifier output is either near the supply voltage or near zero. Continuously varying filtered output levels are achieved by changing only the duty cycle. For example, a high voltage requires the switch to be on longer than 50% of the time as shown in FIG. 2a; a medium voltage requires the switch to be on around 50% of the time as shown in FIG. 2b; and a low voltage requires the switch to be on less than 50% of the time as shown in FIG. 2c.

As the duty cycle or the modulation frequency is increased and the polarity of the second half of the period is switched, the output square wave becomes more reflective of the sinusoidal input as shown in FIG. 3. The increase in modulation frequency also results in efficiency being quite constant as output power varies. However, there is a practical limit to higher frequency switching because of the limitation of the switching speed of the power switching devices, typically transistors.

b. Design Considerations of PWM

The challenge of designing a pulse width modulator is to get enough dynamic range to deliver the specified output while variables such as output current, input voltage, and temperature fluctuate over wide ranges. If output current remains constant, the average energy into the filter inductor must remain constant. As input voltage rises, the energy delivered to the inductor in a given time must be increased. If the input voltage is constant but output current decreases, less energy must be delivered to the inductor. The only variable the controller has to work with is the pulse width, which must be increased or decreased depending upon the load requirement. Therefore, PWM switching control is highly critical in determining the waveform output.

Furthermore, the design of the PWM has to take into considerations the following desired parameters: low internal losses to provide high operating efficiency, leading to small size and low cost equipment; high signal-to-noise ratio to provide quality power to the load; high modulation frequency to produce a variable frequency sine wave with minimum harmonics to minimize motor heating; and high surge ratings to protect against overcurrent and overvoltage conditions, thus improving reliability.

The main problem to resolve for all high-power amplifier and oscillator equipment is the removal of excess thermal energy produced in active devices, which can include switching resistance, diode forward drops, copper losses, and core losses. The temperature rise of the PWM circuit must be within the allowable limit as prescribed by the manufacturer of each component. The PWM circuit therefore must be designed to withstand worst-case internal power dissipation for considerable lengths of time in relationship to the thermal time constants of the heat sinking hardware. Consequently, the PWM circuit has to have the necessary heat dissipation device to cool itself under worst-case conditions, which include highest supply voltage, lowest load impedance, maximum ambient temperature, and lowest efficiency output level. In the case of reactive loads, maximum voltage-to-current phase angle or lowest power factor must also be addressed. The available cooling methods to remove the thermal generation include natural convection, forced convection, and conduction. If the excess thermal energy is not removed properly, the temperature rise can create circuit failure and/or reduce power delivery efficiency.

The other problem to be resolved is noise, or interference, which can be defined as undesirable electrical signals that distort or interfere with the original or desired signal. Examples of noise sources include thermal noise due to electron movement within the electrical circuits, electromagnetic interference due to electric and magnetic fluxes, and other transients that are often unpredictable. The main techniques used to reduce noise consist of applying shielding around signal wires, increasing the distance between the noise source and signal, decreasing the length that the desired signal must travel, and proper grounding of the entire system.

The ratio of the signal voltage to the noise voltage determines the strength of the signal in relation to the noise.

This is called signal-to-noise ratio (SNR) and is important in assessing how well power is being delivered. The higher the SNR, the better the delivery of desired power. PWM amplification system with low SNR may not be suitable for photolithography motor drives and other high performance applications, which may require noise free power.

Further, conventional PWM amplifier systems do not provide drive current in a linear fashion and typically have poor total harmonic distortion (THD) characteristics. The THD and switching transients, which are associated with very high speed rising and falling edges, can cause noise and generate excessive undershoot and overshoot ringing effects. If these voltage spikes were allowed to exist they could cause high stress and possibly destruction of both amplifier and power supply components. To resolve the ringing effects, amplifier must use fast surge suppression to prevent ringing in the output signals.

The design challenges are compounded at higher frequency. As the modulation frequency is increased, a switching loss of each switching element is increased. In other words, use of high speed switching elements allows a decrease in switching loss but causes an increase in conduction loss. Further, pulse dropout occurs in a crest region and a zero-crossing region of the output signal waveform. Therefore, conversion efficiency as a whole is limited and system linearity is compromised.

c. PWM with Feedback Control

The open-loop PWM is adequate if precise control is not required and/or the load is constant. However, in most variable load control applications, a feedback signal is required to monitor if the power delivered matches the load and to adjust the modulating frequency. There are many forms of feedback control as well as variations of pulse modulating circuits as reflected by the numbers that are available in the market.

As described in U.S. Pat. No. 5,436,545, a pilot current detection circuit is used to sample and hold the average load current over a cycle at the midpoint of a first conduction state of a PWM amplifier. A correction circuit then generates a logic signal that measures the time of transition of the PWM amplifier from a second conduction state to an idle state. The logic signal is used to compare with the first sample and hold circuit to provide a scaling factor utilized to correct the average load current. Finally, the average load current and the scaling factor are combined in a multiplier to provide a scaled average load current to be fed back and control power delivered to the load. An error amplifier is used to integrate the difference between command signals and feedback signals. The PWM circuit converts the error amplifier output into a variable duty cycle drive signal, which varies from 0% to 100%. This scaled average load current approach is accurate if the signal has a perfect wave shape. However, in practice, the signal wave shape is superimposed and distorted by numerous static and dynamic noise signals, which may introduce the uncompensated errors in the averaging approach. The inherent problem is that only one sampled average value of the power delivered is taken and projected for compensation for the entire waveform(s).

Further, in the prior art, the rate of sampling and the speed of the feedback are inherently slower than the system overall frequency. This results in critical time delay between the error value, which was calculated from previous cycle(s), and the signal to be compensated which may have changed drastically in the mean time. Instead of requiring an addition of energy, the new signal may require a subtraction of energy. The untimely error feedback may increase the difference between the desired waveform and the actual waveform. As the speed of the system is increased, the error is magnified. Thus, conventional PWM amplifier systems are inadequate to produce the high degree of precision and power transfer efficiency required by current high performance motion control systems.

SUMMARY OF THE INVENTION

The system of the present invention overcomes the difficulties discussed above by calculating the excess or deficient energy, which is created by the aforementioned causes, and compensating for the error in the system as a whole. This is done by controlling the modulation frequency to generate the appropriate duty cycle, and modifying the immediate following pulse(s) based on calculated errors in the immediate preceding pulse. All of the errors, which may cancel each other out to a certain degree, are lumped together and treated as a collective whole. The invention compensates for the imperfections dynamically and almost instantaneously.

In one aspect of the present invention, the PWM system that delivers power to a load in response to an input signal comprises a pulse width modulator, a controller connected to the pulse width modulator, the controller controlling the pulse width modulator to generate a sequence of pulses in response to the input signal, and a detector connected to the controller, the detector determining value related to the error of the pulse based on the information of the pulse and its corresponding ideal pulse, wherein the controller makes the pulse width modulator generate compensated pulse by applying the value related to the error for at least one pulse to respective immediate following pulses in the sequence of pulses.

In one embodiment of the invention, the output energy of every pulse is measured or integrated on a pulse-to-pulse basis. The resulting integrated value of the pulse is subsequently digitized, and fed back to the digital controller. The controller then compares this information with the integrated value of an ideal pulse corresponding to the originally commanded signal, and compensates for any deviations, by adding or subtracting energy to or from the next pulse. By correcting each pulse, within the time frame of one pulse, this corrective action takes place at a frequency much higher than the system frequency. This being the case, the time it takes to make one correction, has little impact on the system response.

The controller can also detect and compensate for any repeating net energy losses, or increases, by treating these as a translation offset. This can also be done by error pattern recognition. One method is to observe the system manually and develop an algorithm. This is done by observing the input signal, the output signal, the difference between the two signals, and superimposing a mathematical equation onto the error portion of the signals. The repetitive errors, which occur in each and every pulse, end up appearing as DC terms in the output. They are only significant if they change over time, otherwise they can be compensated with an offset or a constant.

The final averaged energy of the pulses delivered to the load will thus have a higher accuracy when compared to the original commanded input. Errors from heat, noise, harmonics, ringing waveforms, imperfect square wave replication, and other static or dynamic distortion sources, will thus be compensated for, such that the net output energy will be an accurate representation of the commanded input.

In another aspect of the present invention, a stage device is disclosed which deploys a control system that includes the PWM system in accordance with the present invention. In a further aspect of the present invention, a lithography system is disclosed which deploys a stage device that incorporates the stage device in accordance with the present invention. In yet another aspect of the present invention, an object is formed by the lithography system in accordance with the present invention.

DETAILED DESCRIPTION OF THE ILLUSTRATED EMBODIMENTS

The following description is of the best presently contemplated mode of carrying out the invention. The description is made for the purpose of illustrating the general principles of the invention and should not be taken in a limiting sense. The scope of the invention is best determined by reference to the appended claims.

Figure 1:
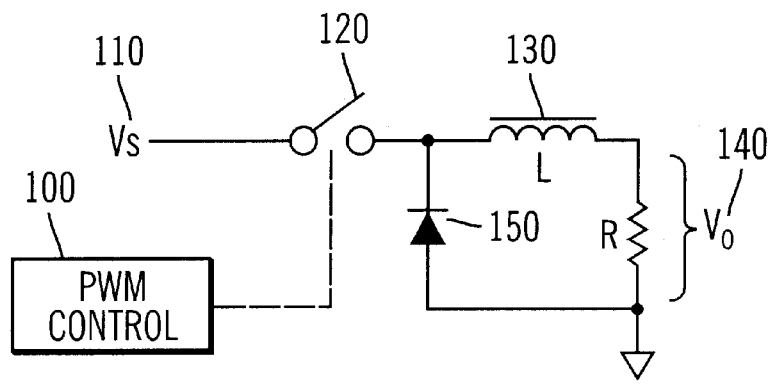
FIG. 1 is a schematic diagram of a prior art open-loop pulse width modulation control circuit.
Figures 2A, 2B, 2C:
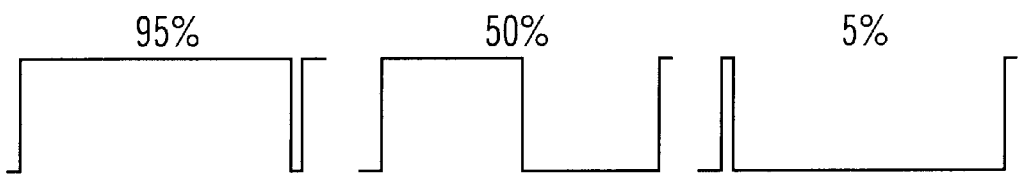
FIGS. 2A–C are waveform diagrams for explaining the operation of the circuit shown in FIG. 1.
Figure 3:
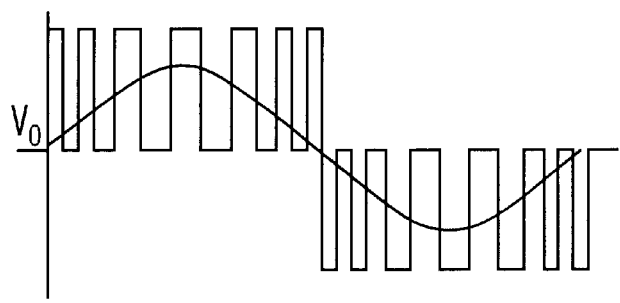
FIG. 3 is a waveform diagram for explaining the operation of the circuit in FIG. 1.
Figure 4:
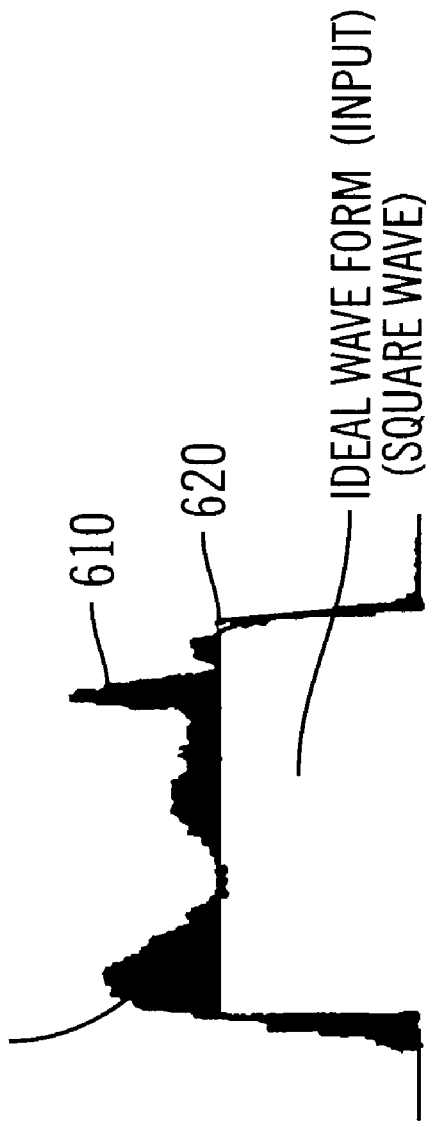
FIG. 4 is a waveform diagram showing the basic concept of the invention.

The basic concept of the invention is to compensate for the imperfect square wave or pulse as shown in FIG. 4. In the drawing, the actual non-ideal waveform output 610 is superimposed onto the ideal waveform commanded input 620. The net power error is the difference between the integrated value of the non-ideal waveform output 610 and the integrated value of the ideal waveform input 620. By knowing the error of the current waveform and feeding this information back to the controller, the controller can compensate for the error in the immediate following waveform. The accuracy that the error is compensated determines the accuracy of the system.

The error compensation can be described mathematically by the following equation:

$$N2=N2c+E1,$$

where $N2c$ is the calculated energy of the next pulse, $E1$ is the error in the energy of the previous pulse (a positive value for deficient energy and a negative value for surplus energy), and $N2$ is the derived command energy of the next pulse. The next pulse is commanded to an energy level that compensates for the error the previous pulse. Since the system energy is an average of the pulses, the errors are in effect aggregated and averaged, thus reducing the excess energy. The error calculated can be compensated in the immediate following waveform, or in another embodiment used to correct a predefined number of subsequent pulses. The invention is different from the prior art because it operates under the mathematical principle that the integrated value of a waveform in relationship to time is more accurate than the average value multiplied by the change in time.

Figure 5:
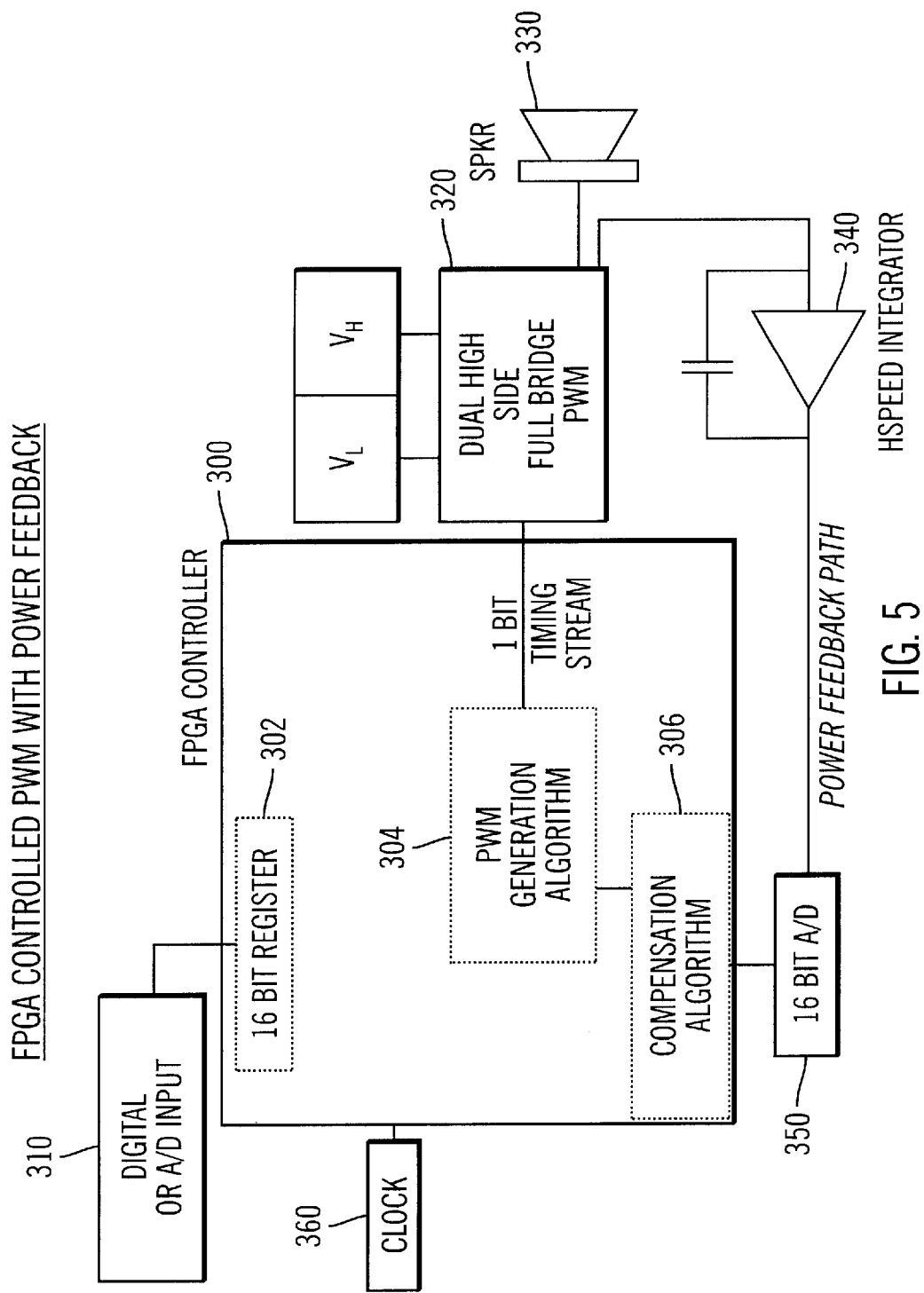
FIG. 5 is a block diagram of a pulse width modulation circuit with feedback in accordance with one embodiment of the present invention.

FIG. 5 shows one embodiment of the present invention, which comprises the following: a digital or analog-to-digital input converter 310, a field programmable gate array (FPGA) 300, a pulse width modulator 320, an output device such as a speaker 330, a high speed integrator power feedback sensor 340, an analog-to-digital feedback input converter 350, and a clock 360 to time the sequence of events.

The field programmable gate array (FPGA) controller 300 is placed between the digital input signal 310 and the PWM 320 (shown in this embodiment as a dual high-side full bridge PWM). The FPGA 300 receives the digital input signal 310 in digital form either directly or via an analog-to-digital converter and places it in its input register 302. In this presentation, the register size is 16-bit, but it can be 32-bit or any other size depending on the precision requirement of the data to be manipulated. At the same time, the FPGA controller 300 also receives the integrated output of the power delivered in the preceding cycle from the high-speed integrator power feedback sensor 340 via the analog-to-digital converter 350. The compensation algorithm 306 inside the FPGA controller calculates the error by subtracting the integrated value of the ideal output from the integrated value of the actual output of the preceding cycle. The error value, which can be offset to incorporate other losses, is then fed to the PWM generation algorithm 304 to generate a 1-bit timing stream and control the modulation frequency of the full bridge PWM 320. The voltage output of the PWM 320 is used to power the speaker 330 or any other load, such as the positioning stage in a photolithographic system.

The whole process is timed by a clock 360 to keep synchronicity. The sampling rate can be equal to the clock rate. However, if the PWM clock rate is very high relative to the system frequency, the PWM controller can be configured to integrate multiple of pulses and feed back the integrated total value. The frequency of the sampling rate is determined by the system frequency, PWM clock rate, and available integration speed. It is recommended that the PWM clock rate should be at least four times the system frequency in order to accurately measure the actual output waveform. Further, the corrective action is taken at the PWM controller frequency. In so doing, the averaged effect of the corrective action renders the PWM extremely faithful to the commanded input.

The invention is applicable to the field of audio since the error compensation occurs in the time frame of one pulse, which is much quicker than that of the system period. For example, if an audio PWM amplifier has an oscillator frequency of 60 Khz, one correction takes place in 17 uS, which is much faster than the audio response rate of the human ear, given as typically 20,000 Hz or 50 uS maximum. Thus, the error compensation can remove the static and dynamic noises before they become noticeable at a frequency that is undetectable by the human ear.

The advantage of this invention is it allows precise control of the PWM waveform output, and thus improving the performance of the connected load device. Because the PWM amplifier system of the present invention is more accurate and efficient than those of the prior art, less energy is consumed and less heat is produced during operation. Since the error to be compensated is less, the frequency of the modulation frequency is also reduced to maintain the desired waveform output. Consequently, the reliability is increased with less damage from thermal degradation and less temperature variations, which aid in predicting the performance of the system. The cooling requirement is also reduced, such as a smaller heat sink, which makes the PWM system smaller in size and less costly to produce. Overall, the present invention compensates for errors that can be caused by total harmonic distortion, ringing waveform, excess thermal energy, and static and dynamic noises to provide highly linear and efficient power output.

The PWM controller of the present invention may be used to control the electric motors of an exposure apparatus, such as a photolithography system. The present invention is applicable to a scanning type photolithography system (see for example U.S. Pat. No. 5,473,410), which exposes a mask pattern by moving a mask and a substrate synchronously. It is also applicable to a step-and-repeat type photolithography system that exposes a mask pattern while a mask and a substrate are stationery and moves the substrate in successive steps for exposure. It is further applicable to a proximity photolithography system that exposes a mask pattern by closely locating a mask and a substrate without the use of a projection optical system. The use of a photo lithography system need not be limited to a photolithography system in semiconductor manufacturing. For instance, it can be widely applied to an LCD photolithography system, which exposes a liquid crystal display device pattern onto a rectangular glass plate, and a photolithography system for manufacturing a thin film magnetic head.

Figure 6:
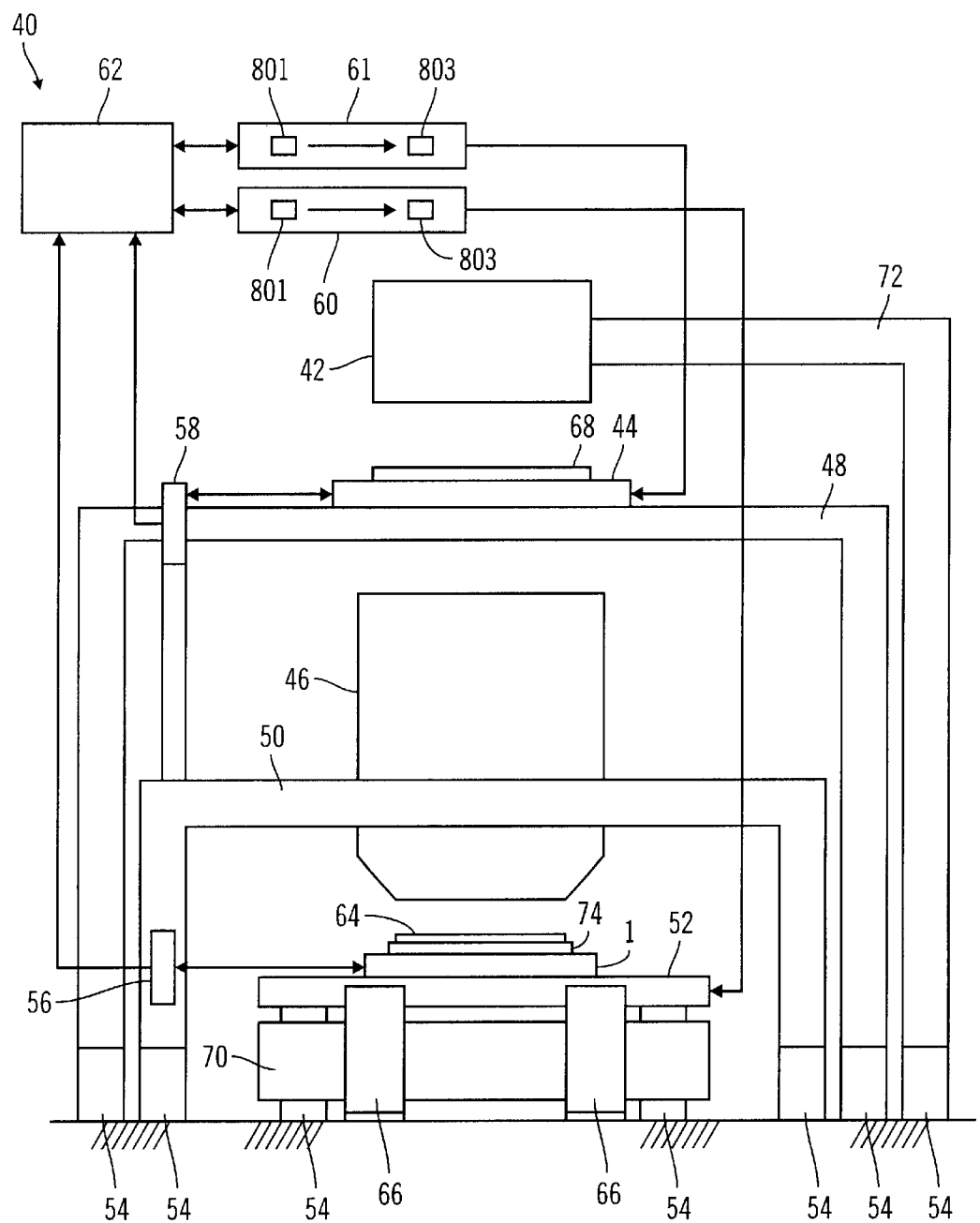
FIG. 6 is a schematic view illustrating a typical photolithography system incorporating the PWM system in accordance with the principles of the present invention.

FIG. 6 is a schematic view illustrating a photolithography apparatus 40 incorporating a wafer positioning stage 52 that is driven by a planar motor and a wafer table 1 that is magnetically coupled to the wafer stage 52 in accordance with the principles of the present invention. The planar motor drives the wafer stage 52 by an electromagnetic force generated by magnets and corresponding armature coils arranged in two dimensions. A wafer 64 is held in place by a wafer chuck 74 which is attached to the wafer table 1. The wafer stage 52 is structured so that it can move in multiple (e.g. three to six) degrees of freedom under precision control by a drive control unit 60 and system controller 62, and position the wafer 64 at a desired position and orientation relative to the projection optics 46.

The wafer table 1 is levitated in the vertical plane by preferably three voice coil motors (not shown). At least three magnetic bearings (not shown) couple and move the wafer table 1 horizontally. The motor array of the wafer stage 52 is supported by a base 70. The reaction force generated by the wafer stage 52 motion can be mechanically released to the ground through a frame 66, in accordance with the structure described in JP Hei 8-166475 (corresponding to U.S. Pat. No. 5,528,118), the entire contents of which are incorporated by reference herein.

An illumination system 42 is supported by a frame 72. The illumination system projects a radiant energy (e.g. light) through a mask pattern on a reticle 68 that is supported by and scanned using a reticle stage 44. The movement of the reticle stage 44 is precisely controlled by a drive control unit 61 and system controller 62. The reaction force generated by motion of the reticle stage can be mechanically released to the ground through the isolators 54, in accordance with the structures described in JP Hei 8-330224 (corresponding to U.S. Pat. No. 5,874,820), the entire contents of which are incorporated by reference herein. The light is focused through a projection optical system 46 supported on a projection optics frame 50 and released to the ground through isolator 54.

The magnification of the projection optical system is not limited to a reduction system. It could be a 1× or a magnification system. When far ultra-violet rays such as excimer laser is used, glass materials such as quartz and fluorite that transmit far ultra-violet rays should be used. When F2 laser or X-ray is used, the optical system should be either catadioptric or refractive (the reticle should also be a reflective type). When an electron beam is used, electron optics should consist of lenses and deflectors, and the optical path for the electron beam should be in a vacuum. The light exposes the mask pattern onto a layer of photoresists on a wafer 64. The light source for the photolithography system may be the g-line (436 nm), I-line (365 nm), KrF excimer laser (248 nm), ArF excimer laser (193 nm) and F2 laser (157 nm). For certain lithography systems, charged particle beams such as X-ray and electron beam may be used. For instance, for electron beam lithography, thermionic emission type lanthanum hexaboride (LaB6) or tantalum (Ta) can be used as an electron gun. Further, for electron beam lithography, the structure could be such that either a mask is used or a pattern can be directly formed on a substrate without the use of a mask.

An interferometer 56 is supported on the projection optics frame 50 and detects the position of the wafer table 1 and outputs the information of the position of the wafer table 1 to the system controller 62. A second interferometer 58 is supported on the reticle stage frame 48 and detects the position of the reticle stage 44 and outputs the information of the position to the system controller 62.

The system controller 62 controls each of the drive control units 60 and 61 for the reticle stage 44 and the wafer stage 52 based on the information of the positions outputted from the interferometers 56 and 58 and the desired positions of the reticle stage 44 and wafer stage 52. Each drive control unit 60 and 61 includes a PWM controller 801 in accordance with the present invention and a PWM drive 803. The PWM controller 62 controls the PWM drive 803, which feeds power to, for example, the planar motor of the wafer stage 52 and the linear motor of the reticle stage. The PWM controller 801 and the PWM drive 803 should be installed close to the motors of the reticle stage 44 and wafer stage 52 to reduce power conduction loss and voltage drop. The linear and planar motor may comprise a magnet array and a coil array facing the magnet array. Either one of the magnet array or coil array may be connected to the moving member of the stage and the other may be connected to the frame 48 or 66.

In the structure of FIG. 6, the PWM controller 801 may include the FGPA 300, the clock 360, the analog-to-digital converter (16 BIT A/D) 360, and the high-speed integrator power feedback sensor 340 shown in FIG. 5. The PWM drive 803 corresponds to the PWM 320 of FIG. 5, and each coil of the coil array corresponds to the speaker 330 as the output. Further, the digital input signal (DIGITAL OR A/D INPUT) of FIG. 5 corresponds to the signal output from the system controller 62 to the PWM controller 801 in the drive control unit (60 or 61).

There are a number of different types of lithographic devices in which the present invention may be deployed. For example, the exposure apparatus 40 can be used as scanning type photolithography system that exposes the pattern from the reticle onto the wafer with the reticle and wafer moving synchronously. In a scanning type lithographic device, the reticle is moved perpendicular to an optical axis of the projection optics 46 by the reticle stage assembly 44 and the wafer is moved perpendicular to an optical axis of the projection optics 46 by the wafer stage assembly (1, 52). Scanning of the reticle and the wafer occurs while the reticle and the wafer are moving synchronously.

Alternately, the exposure apparatus 40 can be a step-and-repeat type photolithography system that exposes the reticle while the reticle and the wafer are stationary. In the step and repeat process, the wafer is in a constant position relative to the reticle and the projection optics 46 during the exposure of an individual field. Subsequently, between consecutive exposure steps, the wafer is consecutively moved by the wafer stage perpendicular to the optical axis of the projection optics 46 so that the next field of the wafer 64 is brought into position relative to the projection optics and the reticle for exposure. Following this process, the images on the reticle are sequentially exposed onto the fields of the wafer so that the next field of the wafer is brought into position relative to the projection optics 46 and the reticle.

Further, the present invention can also be applied to a proximity photolithography system that exposes a mask pattern by closely locating a mask and a substrate without the use of a lens assembly.

The use of the exposure apparatus 40 provided herein is not limited to a photolithography system for semiconductor manufacturing. The exposure apparatus 40, for example, can be used as an LCD photolithography system that exposes a liquid crystal display device pattern onto a rectangular glass plate or a photolithography system for manufacturing a thin film magnetic head.

As described above, a photolithography system according to the above-described embodiments can be built by assembling various subsystems, including each element listed in the appended claims, in such a manner that prescribed mechanical accuracy, electrical accuracy and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, a total adjustment is performed to make sure that accuracy is maintained in the complete photolithography system. Additionally, it is desirable to manufacture an exposure system in a clean room where the temperature and cleanliness are controlled.

Figure 7:
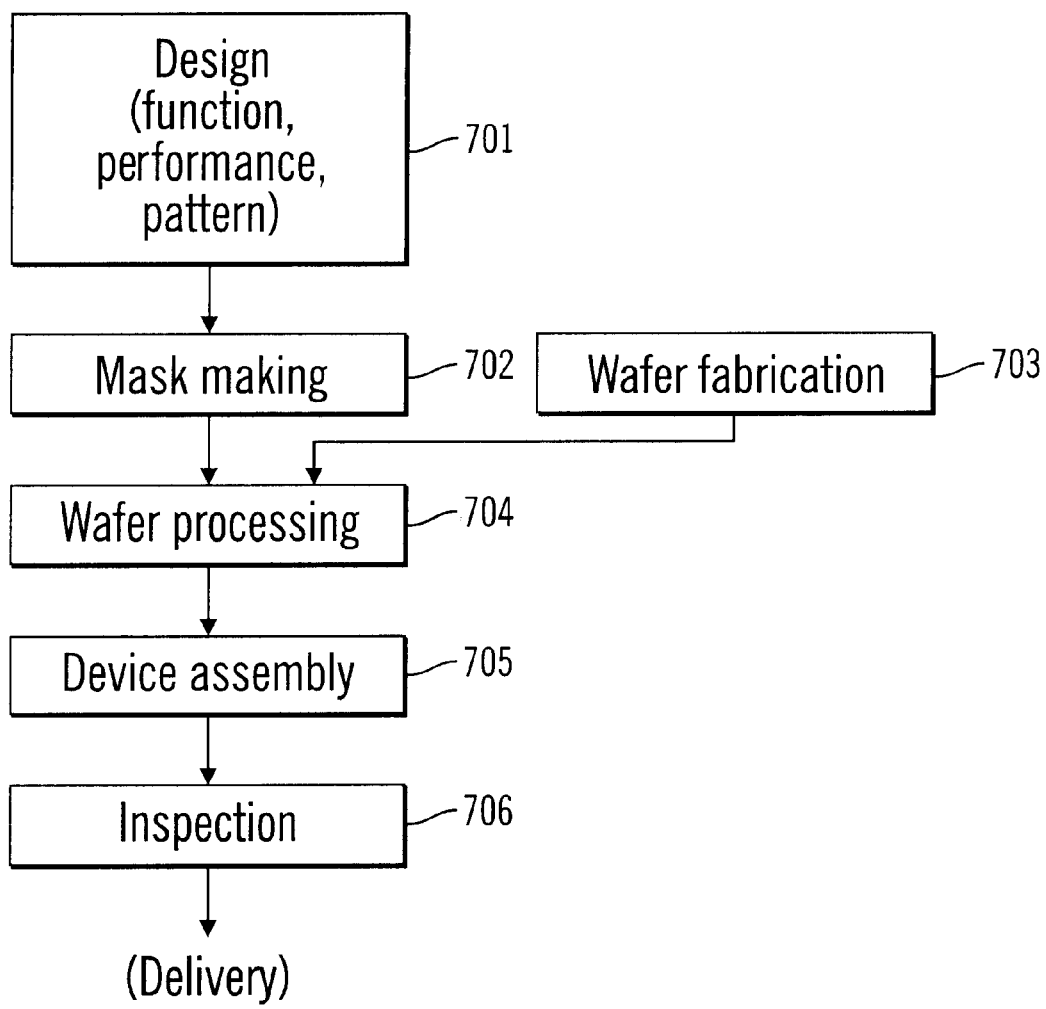
FIG. 7 is a block diagram of a general fabrication process for semiconductor devices.

Further, semiconductor devices can be fabricated using the above described systems, by the process shown generally in FIG. 7. In step 701 the device's function and performance characteristics are designed. Next, in step 702, a mask (reticle) having a pattern is designed according to the previous designing step, and in a parallel step 703 a wafer is made from a silicon material. The mask pattern designed in step 702 is exposed onto the wafer from step 703 in step 704 by a photolithography system described hereinabove in accordance with the present invention. In step 705 the semiconductor device is assembled (including the dicing process, bonding process and packaging process), then finally the device is inspected in step 706.

Figure 8:
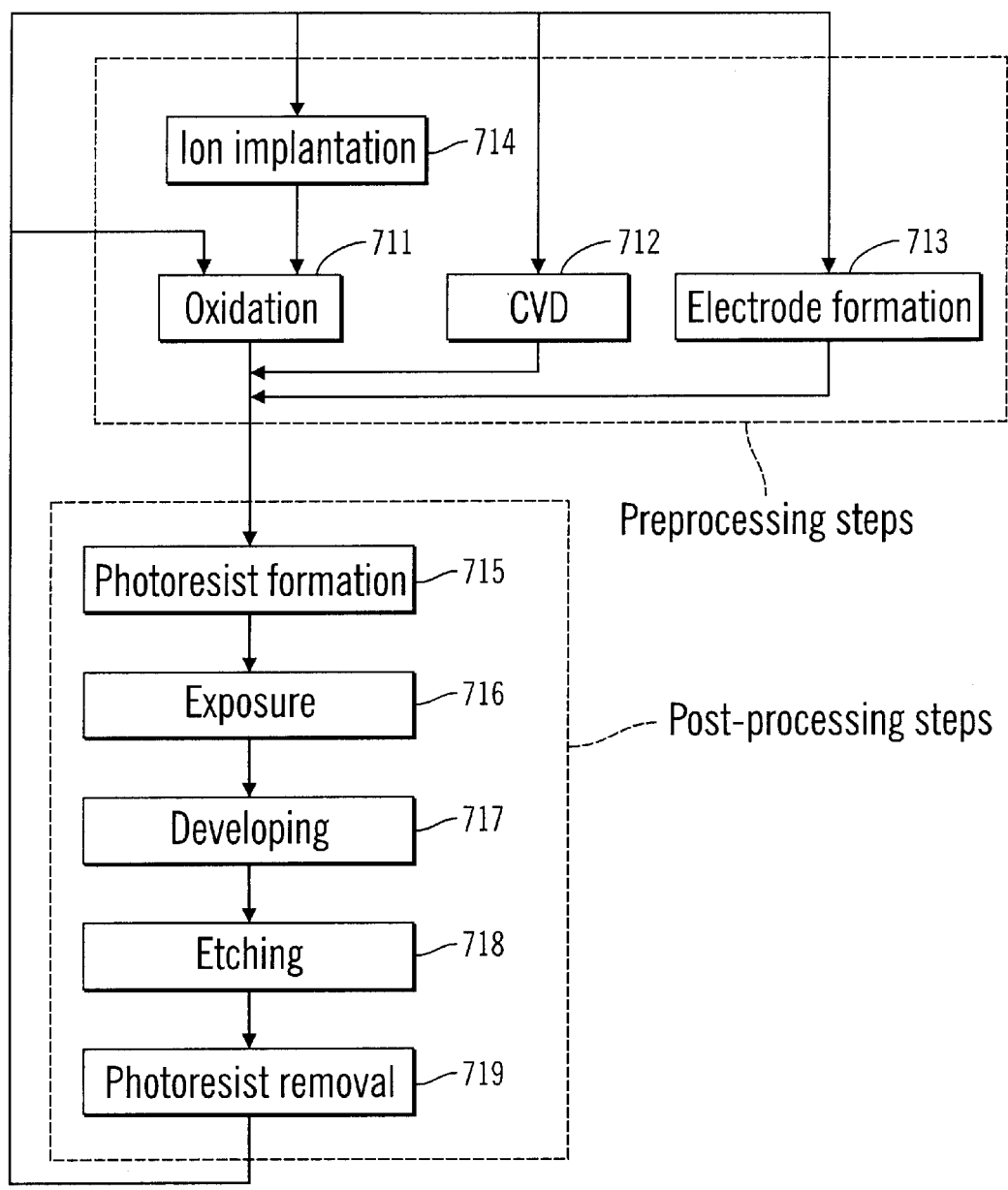
FIG. 8 is a detailed block diagram of fabricating semiconductor devices.

FIG. 8 illustrates a detailed flowchart example of the above-mentioned step 704 in the case of fabricating semiconductor devices. In FIG. 8, in step 711 (oxidation step), the wafer surface is oxidized. In step 712 (CVD step), an insulation film is formed on the wafer surface. In step 713 (electrode formation step), electrodes are formed on the wafer by vapor deposition. In step 714 (ion implantation step), ions are implanted in the wafer. The above-mentioned steps 711–714 form the preprocessing steps for wafers during wafer processing, and selection is made at each step according to processing requirements.

At each stage of wafer processing, when the above-mentioned preprocessing steps have been completed, the following post-processing steps are implemented. During post-processing, first, in step 715 (photoresist formation step), photoresist is applied to a wafer. Next, in step 716 (exposure step), the above-mentioned exposure device is used to transfer the circuit pattern of a mask (reticle) to a wafer. Then, in step 717 (developing step), the exposed wafer is developed, and in step 718 (etching step), parts other than residual photoresist (exposed material surface) are removed by etching. In step 719 (photoresist removal step), unnecessary photoresist remaining after etching is removed.

Multiple circuit patterns are formed by repetition of these preprocessing and post-processing steps.

It is to be understood that the photolithography system may be different than the one shown herein and other types of exposure apparatus and apparatus having PWM drives may be implemented with the PWM control of the present invention without departing from the scope and spirit of the invention.

While the present invention is described herein with reference to particular applications, it should be understood that the invention is not limited hereto. It will be apparent to those skilled in the art that various modifications and improvements may be made without departing from the scope and spirit of the invention. For example, the inventive concepts herein may be applied to any forms of load control where the controller can be a field programmable gate array, digital signal processor, microprocessor, programmable logic controller, or another other electrical equipment with processing capability. It could be implemented as a hybridized module, which contains all the electronics necessary to perform the amplification function. The location of the processor and any of the signals can be placed locally and/or remotely via a network. The load can be precise power amplification, such as that required for high fidelity audio systems; other precision amplification, such as that of positioning stages within semiconductor lithography equipment; or any other motor that requires accurate control. Accordingly, it is to be understood that the invention is not to be limited by the specific illustrated embodiments, but only by the scope of the appended claims.

I claim:

1. A PWM system that delivers power to a load in response to an input signal, comprising:
    a pulse width modulator;
    a controller configured to control the modulator to generate a sequence of pulses representing a pulse-width modulated signal in response to the input signal, wherein at least some of the pulses include modulation error; and
    a feedback system connected to the controller and the pulse width modulator, the feedback system feeding the modulation error for each pulse from the modulator to the controller;
    wherein the controller is further configured to determine the modulation error in each pulse and apply the modulation error for each pulse to respective immediate following pulses in the sequence of pulses to compensate for the modulation error in each pulse.

2. A PWM system as in claim 1, wherein the controller is configured to determine the modulation error by comparing each pulse to its corresponding ideal pulse.

3. A PWM system as in claim 2, wherein the controller is configured to determine the modulation error by comparing a time integrated energy value of each pulse to a time integrated energy value of its corresponding ideal pulse.

4. A PWM system as in claim 3, wherein the controller is further configured to control the modulator such that the modulation error of a pulse is subtracted from the immediate following pulse when the modulation error represents surplus energy in the pulse compared to a corresponding ideal pulse, and the modulation error of a pulse is added to the immediate following pulse when the modulation error represents deficient energy in a pulse compared to a corresponding ideal pulse.

5. A PWM system as in claim 4, wherein the controller comprises a FPGA device.

6. A PWM system as in claim 1, wherein the PWM system operates at a system frequency, the controller is further configured to control the modulator to generate the sequence of pulses at a PWM frequency that is higher than the system frequency.

7. A PWM system as in claim 6, wherein the PWM frequency is at least four times the system frequency.

8. A PWM system as in claim 1, wherein the load is a motor drive.

9. A PWM system as in claim 1, wherein the load is a motor drive in an exposure apparatus.

10. A method of controlling a pulse width modulator to deliver power to a load in response to an input signal, comprising the steps of:

controlling the modulator to generate a sequence of pulses representing a pulse-width modulated signal in response to the input signal, wherein at least some of the pulses include modulation error;

feeding the modulation error for each pulse from the modulator to the controller;

determining the modulation error in each pulse; and applying the modulation error for each pulse to respective immediate following pulses in the sequence of pulses to compensate for the modulation error in each pulse.

11. A PWM system that delivers power to a load in response to an input signal, comprising:

a pulse width modulator;

a controller connected to the pulse width modulator, the controller controlling the pulse width modulator to generate a sequence of pulses in response to the input signal; and a detector connected to the controller, the detector determining value related to the error of the pulse based on the information of the pulse and its corresponding ideal pulse;

wherein the controller makes the pulse width modulator generate compensated pulse by applying the value related to the error for at least one pulse to respective immediate following pulses in the sequence of pulses.

* * * * *